US005896263A

United States Patent [19]
Terdan et al.

[11] Patent Number: 5,896,263
[45] Date of Patent: Apr. 20, 1999

[54] OUTPUT CIRCUIT HAVING ELECTRONIC OVERLOAD PROTECTION ACTIVATED BY VOLTAGE DROP ACROSS OUTPUT TRANSISTOR

[75] Inventors: Dale R. Terdan, Concord Township; John R. O'Connell, Willoughby, both of Ohio

[73] Assignee: Allen-Bradley Company, LLC, Milwaukee, Wis.

[21] Appl. No.: 08/884,305

[22] Filed: Jun. 27, 1997

[51] Int. Cl.$^6$ .................................................. H02H 3/00
[52] U.S. Cl. ........................................... 361/101; 361/111
[58] Field of Search .............................. 361/57, 86, 87, 361/79, 93, 101, 111

[56] References Cited

U.S. PATENT DOCUMENTS

| | | | |
|---|---|---|---|
| 3,665,253 | 5/1972 | Stefani | 317/22 |
| 3,748,569 | 7/1973 | Frank et al. | 323/9 |
| 4,481,553 | 11/1984 | Owen et al. | 361/93 |
| 4,538,198 | 8/1985 | Imanishi et al. | 361/86 |
| 4,695,915 | 9/1987 | Mahalek et al. | 361/101 |
| 4,835,649 | 5/1989 | Salerno | 361/101 |
| 4,918,564 | 4/1990 | Walker et al. | 361/101 |

*Primary Examiner*—Jeffrey Gaffin
*Assistant Examiner*—Kim Huynh
*Attorney, Agent, or Firm*—David G. Luettgen; John M. Miller; John J. Horn

[57] ABSTRACT

An output circuit has multi-stage protection circuitry for protecting against different fault current conditions. The protection circuitry operates by detecting voltage changes across the output transistor of the output circuit. The output circuit comprises first, second and third switching devices. The first switching device is connected to the output device and power conditions the output signal. The second and third switching devices override the output signal and turn off the first switching device when a magnitude of current through the first switching device exceeds predetermined magnitudes for predetermined amounts of time. A protection circuit is also disclosed which has a sensing device that senses a current flow condition by sensing a voltage drop produced across two terminals of the first power conditioning transistor, the two terminals being the terminals through which the current flows. Advantageously, the output circuit utilizes highly flexible two-stage protection circuitry. The protection circuitry separately identifies surge current and overcurrent conditions. In addition to the flexibility provided by the use of two-stage protection circuitry, flexibility is also provided by the fact that component values may be easily varied to vary the magnitudes/durations of current within each stage which activate the protection circuitry. Moreover, the protection circuitry has a very fast response time. As a result, an output transistor which is protected by the protection circuitry of the present invention suffers much less stress in the event of a short circuit condition.

20 Claims, 3 Drawing Sheets

OUTPUT CIRCUIT HAVING ELECTRONIC OVERLOAD PROTECTION ACTIVATED BY VOLTAGE DROP ACROSS OUTPUT TRANSISTOR

FIELD OF THE INVENTION

This invention relates to output circuits, and more particularly relates to an output circuit having electronic overload protection.

DESCRIPTION OF RELATED ART

Output circuits are widely used for interfacing output control signals received from a control circuit with output devices. The output control signals generated by typical control circuits (such as a programmable logic controller) are typically low level signals which are sufficient only to drive low power circuit components (such as a light emitting diode), and are not sufficient to drive typical output devices (such as a relay or a motor). Therefore, output circuits are used to condition the output control signal so that devices which draw more power may be driven.

Output circuits are sometimes provided with protection against fault current conditions such as surge current conditions and overcurrent conditions. For example, if the output device is incorrectly connected to the output circuit, a short circuit may result and the output device may draw more current than expected. Protection is often provided which prevents such a short circuit from destroying the output circuit.

In the past, various approaches have been taken for providing such protection. One approach has been to use current-limited output transistors. These transistors prevent the output current from exceeding a predefined level. This approach suffers the drawback that such transistors do not permit acceptable minor surge currents. Specifically, the current drawn by certain (inductive) devices is higher when the device is first turned on, but then drops in the steady state. The use of self-limited transistors in this situation is unacceptable, because the transistor used must be rated for a current which is higher than the steady state current, otherwise the transistor will be unable to turn on the device. This is a common situation in the context of programmable controllers, because the output devices are often relays or lamps (which draw a large current when turned on and a much smaller current in the steady state).

Another approach has been to provide a thermal detection system which detects an increase in the heat dissipated by the output transistor of the output circuit. The assumption underlying this approach is that increased current through the output transistor results in more heat dissipation by the output transistor. This approach suffers the drawback that such thermal detection systems are slow to detect short circuits. A sudden change in the temperature of the output transistor is not immediately detected by the thermal detection system. Thus, thermal detection systems permit the output transistor to suffer an undue amount of stress in short circuit situations.

A third approach has been to provide a sensing resistor in series with the output device which creates a voltage representative of current sourced by the output circuit. This approach suffers the drawback that such sensing resistors are expensive and dissipate a substantial amount of heat.

In addition to these specific drawbacks of these specific approaches, most approaches which have been provided up until now have also suffered from the drawback that they are inflexible in terms of the amount of current and/or the duration of current required to activate the protection system. For example, with respect to current-limited transistors, the duration of current is not considered by the protection system. Moreover, it is generally not possible to adjust the amount of current which activates the protection system without utilizing a different output transistor. With respect to thermal detection systems, the relationship between the magnitude/duration of current and the detected temperature is indirect and, in any event, it is impossible to adjust individually the magnitude and duration of current which activate the protection system. Finally, with respect to both types of systems, only a single protection stage is used (i.e., activation occurs at a specific current magnitude or at a specific temperature), and there is no flexibility provided by the use of multiple protection stages.

What is needed is an output circuit having protection circuitry which overcomes these and other drawbacks of prior art output circuits.

BRIEF SUMMARY OF THE INVENTION

An output circuit having protection circuitry which overcomes these and other drawbacks is disclosed. More specifically, a protection circuit according to the present invention protects an output circuit having a first transistor which provides power conditioning for an output signal that controls an output device. The protection circuit comprises a sensing device and a second transistor. The sensing device is connected to the first power conditioning transistor and senses a current flow condition. The current flow condition involves a current which flows through the first power conditioning transistor and which is supplied to the output device.

The second transistor is connected to the sensing device and to the first power conditioning transistor. The second transistor responds to the sensing device during the current flow condition by overriding the output signal and turning off the first power conditioning transistor. The sensing device senses the current flow condition by sensing a voltage drop produced across two terminals of the first power conditioning transistor, the two terminals being the terminals through which the current flows.

In another embodiment, an output circuit for power conditioning an output signal which controls an output device comprises first, second and third switching devices. The first switching device is connected to the output device. The first switching device turns on when the output signal assumes a first state and turns off when the output signal assumes a second state. The first switching device power conditions the output signal.

The second switching device is connected to the first switching device. The second switching device overrides the output signal and turns off the first switching device when a magnitude of current through the first switching device exceeds a first predetermined magnitude for a first predetermined amount of time.

The third switching device is also connected to the first switching device. The third switching device overrides the output signal and turns off the first switching device when the magnitude of current through the first switching device exceeds a second predetermined magnitude for a second predetermined amount of time.

The protection circuit and output circuit according to the present invention offer numerous advantages. First, the output circuit utilizes highly flexible two-stage protection circuitry. The protection circuitry separately identifies surge current and overcurrent conditions. In addition to the flexibility provided by the use of two-stage protection circuitry, flexibility is also provided by the fact that component values may be easily varied to vary the magnitudes/durations of current within each stage which activate the protection circuitry. Second, the protection circuitry has a very fast response time. The protection circuitry operates by detecting voltage changes across the output transistor. As a result, an output transistor which is protected by the protection circuitry of the present invention suffers much less stress in the event of a short circuit condition. Third, the output circuit does not use a sensing resistor. Therefore, the expense and heat dissipation associated with protection circuits which do use sensing resistors is avoided. Fourth, the output circuit is implemented with a relatively small number of components, thereby making the output circuit inexpensive to implement and easy to implement in the form of an integrated circuit. Fifth, the output circuit is relatively insensitive to temperature variations. Finally, the arrangement and configuration of the output circuit make the output circuit relatively robust as against a variety of current conditions.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1:
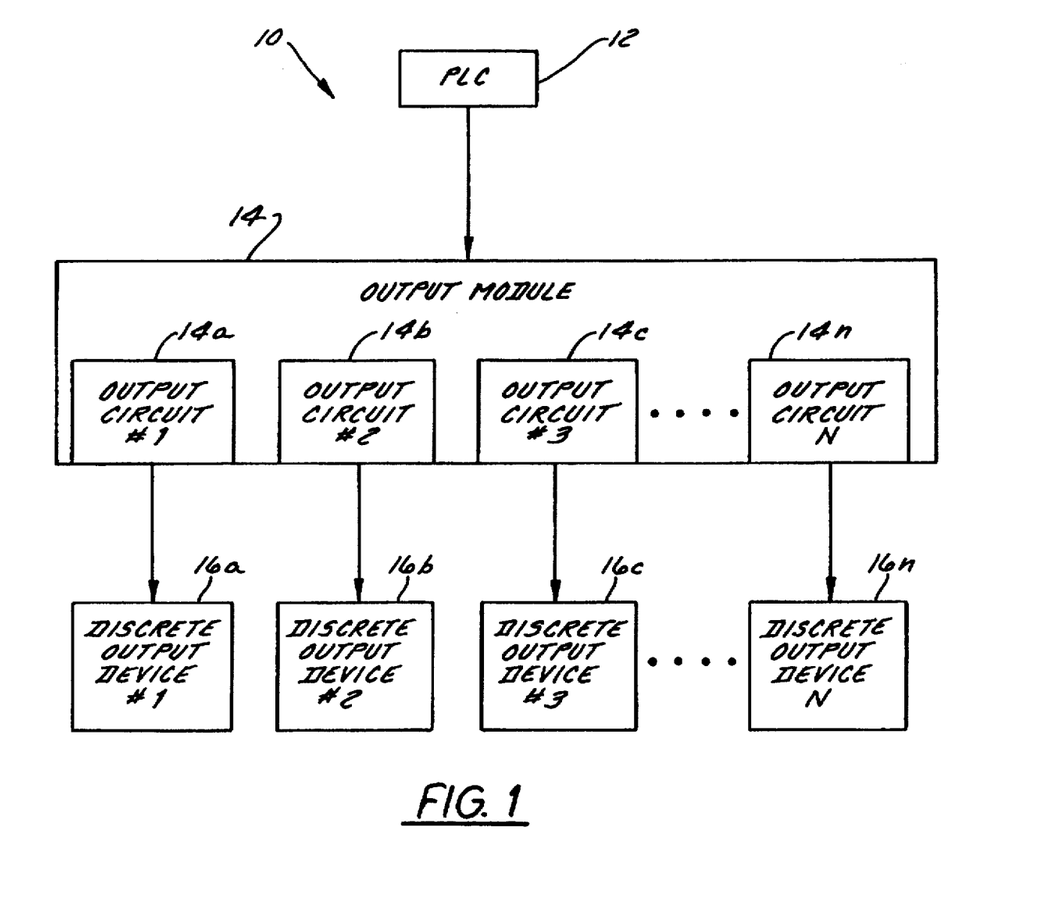
FIG. 1 illustrates a programmable controller system having an output module which utilizes a plurality of output circuits according to the present invention.

Referring now to FIG. 1, a programmable controller system 10 having an output module 14 which utilizes a plurality of output circuits 14a–14n constructed in accordance with the present invention is illustrated. The output module 14 could be of a type which plugs into the same backplane as the processor module of the programmable controller system 10, or alternatively could be located in a Remote I/O rack and connected to the programmable controller system by way of a Remote I/O interface. The output module 14 utilizes the plurality of output circuits 14a–14n to interface n number of output control signals with n number of discrete output devices 16a–16n.

Figure 2:
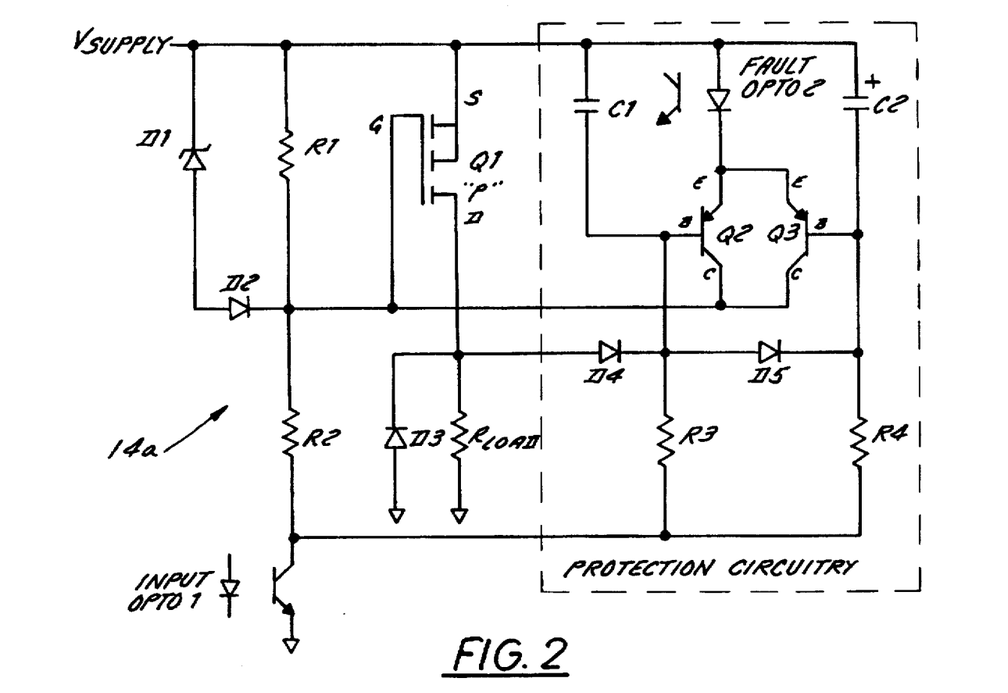
FIG. 2 illustrates an output circuit according to the present invention.

Referring now to FIG. 2, a more detailed view of an output circuit 14a according to the present invention is illustrated. By way of overview, the output circuit comprises three switches or transistors Q1, Q2 and Q3. The first transistor Q1 is an output transistor which provides power conditioning for the output signal received at an input optoisolator OPTO1: The first transistor Q1 mirrors the state of the output signal (assuming the output signal is not overridden by one of the transistors Q2 and Q3) but is able to source a current having a higher amperage than the output signal. The second transistor Q2, which has an output connected to the signal input of the first transistor Q1, overrides the output signal and turns off the first transistor when a current surge condition is detected. The third transistor Q3, which also has an output connected to the signal input of the first transistor Q1, overrides the output signal and turns off the first transistor Q1 when an overcurrent condition is detected. The remaining components of the protection circuitry define the parameters (in terms of duration and magnitude) of the current surge and overcurrent conditions which cause the transistors Q2 and Q3, respectively, to turn on.

More specifically, the power conditioning circuitry is discussed in greater detail first. An output signal is received at the LED of the input optoisolator OPTO1, which turns on when the output signal goes high and turns off when the output signal goes low. When the input optoisolator LED turns on, the input optoisolator transistor also turns on thereby permitting current to flow through resistors R1 and R2 and into ground. When current flows through the resistor R1, a voltage across the resistor R1 is created which is sufficient to turn on the transistor Q1 (assuming the transistors Q2 and Q3 remain turned off). When the transistor Q1 is turned on, a current flows through the voltage supply input and through the output of the transistor Q1 and into the output device $R_{LOAD}$. In the illustrated embodiment, the voltage supply input is the source of the transistor Q1 (because the source is more closely associated with one of the terminals of the power supply, in this case the $V_{SUPPLY}$ terminal) and the output is the drain of the transistor Q1 (because the drain is more closely associated with the output device $R_{LOAD}$). The transistor Q1 is selected such that it is able to source a current having a higher amperage than the input signal received at the input optoisolator OPTO1; accordingly, the transistor Q1 power conditions the output signal for driving the output device.

Preferably, the output circuit 14a also comprises diodes D1 and D2 which provide voltage clamping for the transistor Q1, so that the voltage appearing across the gate and source of the transistor Q1 does not exceed the rated voltage. The diodes D1 and D2 also ensure a more constant gate-source and drain-source resistance when the magnitude of the voltage supply is varied. A diode D3 is provided across the output device $R_{LOAD}$ to provide a path for inductive current when the transistor Q1 is turned off.

Notably, whenever a current flows through the drain and source of the transistor Q1, a voltage across the drain and source is created (due to the internal resistance between the drain and source of the transistor Q1). The larger the current, the larger the voltage that is created. The protection circuitry uses this fact to detect and respond to surge current and overcurrent conditions. Specifically, a surge current causes the voltage seen at the input of the transistor Q2 to become large enough that the transistor Q2 turns on. An overcurrent condition causes the voltage seen at the input of the transistor Q3 to become large enough that the transistor Q3 turns on. When either of the transistors Q2 or Q3 turn on, the transistor Q1 turns off.

The surge protection circuitry is now discussed in greater detail. The surge protection circuitry is the first stage of a two stage protection circuit formed by the transistors Q2 and Q3 and supporting components. The surge protection circuitry includes the transistor Q2 and a sensing circuit formed by a resistor R3, a diode D4, a fault optoisolator OPTO2 and a capacitor C1.

The resistor R3 creates an additional current path between the $V_{SUPPLY}$ terminal of the voltage supply and the ground terminal of the voltage supply. In steady state, the current through the resistor R3 flows either through the transistor Q1 and the diode D4 or through the LED of the fault optoisolator OPTO2 and the transistor Q2. The two possible current paths for the current which flows through the resistor R3 correspond to the two possible output states of the transistor Q1.

If the voltage created across the drain and source of the transistor Q1 is not sufficient to cause the transistor Q2 to turn on (i.e., the voltage across the drain and source of the transistor Q1 plus the voltage across the diode D4 is less than the $V_{BE}$ turn-on voltage of the second transistor Q2 plus the forward bias voltage of the LED of the fault optoisolator OPTO2), then the transistor Q2 stays off and the transistor Q1 remains on. In this case, the current flows through the resistor R3 from the transistor Q1 and the diode D4.

If the voltage created across the drain and source of the transistor Q1 is sufficient to cause the transistor Q2 to turn on (i.e., the voltage across the drain and source of the transistor Q1 plus the voltage across the diode D4 is greater than the $V_{BE}$ turn on voltage of the second transistor Q2 plus the forward bias voltage of the LED of the fault optoisolator OPTO2), then the transistor Q2 turns on and the transistor Q1 turns off. In this case, the current flows through the resistor R3 from the fault optoisolator LED and the transistor Q2.

This latter situation occurs when the transistor Q1 encounters a surge current due to a short circuit or severe overload. The surge current causes the voltage across the drain and source of the transistor Q1 to increase (due to the resistance between the drain and source of the transistor Q1). This increased voltage causes the voltage which appears across the fault optoisolator OPTO2 and the transistor Q2 (and, specifically, the base and the emitter of the transistor Q2) to increase, so that the fault optoisolator becomes forward biased and the transistor Q2 turns on. When the fault optoisolator becomes forward biased, a bias current flows from the base to the emitter of the transistor Q2. The bias current is produced by the voltage across the $V_{SUPPLY}$ terminal and the base of the transistor Q2, which is the same as the voltage across the drain and source of the transistor Q1 plus the voltage across the diode D4. Thus, the voltage across the drain and source of the transistor Q1 (in combination with the voltage across the diode D4) produces the bias current that flows through the transistor Q2 and that turns on the transistor Q2. The diode D4 prevents any of the bias current from flowing through the load (except to the extent of any leakage current). When the transistor Q2 turns on, the voltage input to the first transistor Q1 (the voltage seen across the gate and the source) drops to a level which is below that required to keep the first transistor Q1 turned on, and so the first transistor Q1 turns off.

However, before this steady state condition is reached, the capacitor C1 must first be charged. Initially, the capacitor C1 is not charged and therefore appears as a short circuit across the voltage supply and the base of the transistor Q2. This temporarily prevents the fault optoisolator from becoming forward biased and the transistor Q2 from turning on. This time delay gives the transistor Q1 a chance to turn on, and prevents the transistor Q2 from immediately turning on and latching the first transistor Q1 off before the first transistor Q1 ever has a chance to turn on. The transistor Q2 turns on when the capacitor C1 reaches a predetermined charge level which corresponds to the forward bias voltage of the LED of the fault optoisolator added to the $V_{BE}$ turn on voltage of the transistor Q2.

The transistor Q2 protects against surge current conditions, which preferably includes short circuit conditions. If it is desired to ensure that the transistor Q1 is adequately protected in a short circuit condition, then a transistor Q1 can be selected which is able to handle short circuit current (i.e., the current produced when $R_{LOAD}=0$ ohms) until the transistor Q2 can be turned on. (The short circuit current is equal to the supply voltage divided by the internal drain to source resistance of the transistor Q1 plus any circuit impedances in series with the output device $R_{LOAD}$.) Also, the diode D1 can be used to reduce the short circuit current magnitude by limiting the gate-source voltage of the transistor Q1. This allows the transistor Q1 to act as a constant current device for limited durations.

When the fault optoisolator OPTO2 becomes forward biased, the LED of the fault optoisolator OPTO2 illuminates and current flows between the collector and emitter of the fault optoisolator OPTO2. This provides a way to signal other control signal circuitry (not illustrated) that a fault situation exists. This could be used to implement an automatic restart feature, wherein the detection of a fault causes the output signal received at the input optoisolator OPTO1 to go low for an extended period, and thereafter go high and reactivate the output circuit. Note that although only a single fault optoisolator is shown for both transistors Q2 and Q3, separate fault optoisolators could instead be used for each of the transistors Q2 and Q3 individually.

The overcurrent protection circuitry is now discussed in greater detail. The overcurrent protection circuitry is the second stage of the two stage protection circuit formed by the transistors Q2 and Q3 and supporting components. The overcurrent protection circuitry includes the transistor Q3 and an overcurrent sensing circuit formed by the diode D4, the fault optoisolator, a resistor R4, a diode D5, and a capacitor C2.

Like a surge current condition, an overcurrent condition means that the transistor Q1 is sourcing too much current. However, the amount by which the sourced current is "too much" is less in an overcurrent situation. An example of an overcurrent situation is where a transistor is rated to source five amps, but an output device which draws seven amps is connected. This smaller amount of excess current, while acceptable if present for only a short duration, is not acceptable if present for a long duration.

Generally speaking, the overcurrent protection circuitry operates in a similar manner as the surge protection circuitry. One difference is that the voltage drop across the diode D5 is also used (in addition to the voltage drop across the source and drain of the transistor Q1 and the voltage drop across the diode D4) in determining whether or not the LED of the fault optoisolator OPTO2 becomes forward biased and the transistor Q3 turns on. Thus, as compared to the surge protection circuitry, a smaller amount of current through the transistor Q1 is required to turn on the transistor Q3 (as compared to the transistor Q2). (However, the overcurrent protection circuitry is designed such that the "smaller" amount of current is still an amount of current which exceeds the rated maximum of the transistor Q3.) Another difference is that the capacitor C2 is much larger than the capacitor C1. This results in a much longer time period during which the capacitor C2 must be charged in order to turn on the transistor Q3 (as compared to the transistor Q2). In short, whereas the surge protection circuitry has the transistor Q2 which is turned on by a comparatively large current of a comparatively short duration, the overcurrent protection circuitry has the transistor Q3 which is turned on by a comparatively small current of a comparatively long duration.

The resistor R4 creates an additional current path between the $V_{SUPPLY}$ terminal of the voltage supply and the ground terminal of the voltage supply. In steady state, the current through the resistor R4 flows either through the transistor Q1 and the diodes D4 and D5 or through the LED of the fault optoisolator OPTO2 and the transistor Q3. The two possible current paths for the current which flows through the resistor R4 correspond to the two possible output states of the transistor Q1.

If the voltage created across the drain and source of the transistor Q1 is not sufficient to cause the transistor Q3 to turn on (i.e., the voltage across the drain and source of the transistor Q1 plus the voltage across the diodes D4 and D5 is less than the $V_{BE}$ turn on voltage of the third transistor Q3 plus the forward bias voltage of the LED of the fault optoisolator OPTO2), then the transistor Q3 stays off and the transistor Q1 remains on. In this case, the current flows through the resistor R4 from the transistor Q1 and the diodes D4 and D5.

If the voltage created across the drain and source of the transistor Q1 is sufficient to cause the transistor Q3 to turn on (i.e., the voltage across the drain and source of the transistor Q1 plus the voltage across the diodes D4 and D5 is greater than the $V_{BE}$ turn on voltage of the third transistor Q3 plus the forward bias voltage of the LED of the fault optoisolator OPTO2), then the transistor Q3 turns on and the transistor Q1 turns off. In this case, the current flows through the resistor R4 from the LED of the fault optoisolator OPTO2 and the transistor Q3.

This latter situation occurs when the transistor Q1 encounters an overcurrent condition. The overcurrent condition causes the voltage across the drain and source of the transistor Q1 to increase (due to the resistance between the drain and source of the transistor Q1). This increased voltage causes the voltage which appears across the LED of the fault optoisolator OPTO2 and the transistor Q3 (and, specifically, the base and the emitter of the transistor Q3) to increase, so that the LED of the fault optoisolator OPTO2 becomes forward biased and the transistor Q3 turns on. When the transistor Q3 turns on, the voltage input to the first transistor (the voltage seen across the gate and the source) drops to a level which is below that required to keep the first transistor Q1 turned on, and so the first transistor Q1 turns off.

However, before this steady state condition is reached, the capacitor C2 must first be charged. Initially, the capacitor C2 is not charged and therefore appears as a short circuit across the voltage supply and the base of the transistor Q3. This temporarily prevents the fault optoisolator from becoming forward biased and the transistor Q3 from turning on. This time delay gives the transistor Q1 a chance to turn on, and prevents the transistor Q3 from immediately turning on and latching the first transistor Q1 off before the first transistor Q1 ever has a chance to turn on. The transistor Q3 turns on when the capacitor C2 reaches a predetermined charge level which corresponds to the forward bias voltage of the LED of the fault optoisolator OPTO2 added to the $V_{BE}$ turn on voltage of the transistor Q3.

The transistor Q3 protects against overcurrent conditions. If it is desired to ensure that the transistor Q1 is adequately protected, then the transistor Q1 must be able to thermally handle the overcurrent until the transistor Q3 turns off the transistor Q1.

Figure 3:
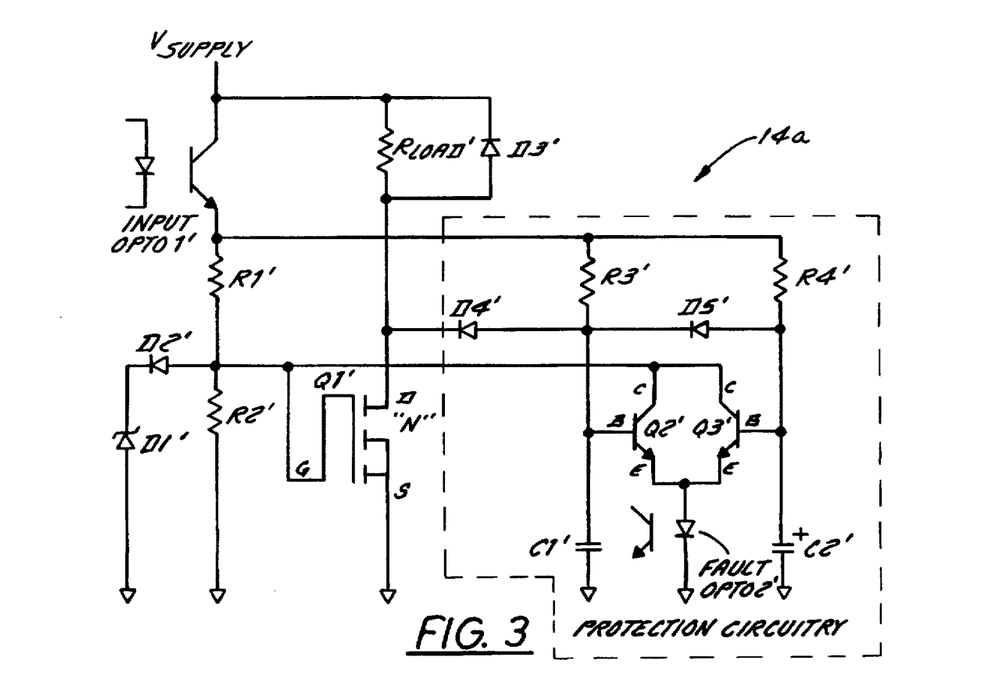
FIG. 3 illustrates an alternative embodiment of the output circuit illustrated in FIG. 2, according to the present invention.

Referring now to FIG. 3, an alternative embodiment of the output circuit of FIG. 2 is illustrated. All of the components of FIG. 3 correspond to one of the components of FIG. 2, and so the same reference designations are used in FIG. 3 (except that they have been primed) to show the correspondence between the components of FIG. 2 and the components of FIG. 3. The output circuit of FIG. 3 has a current sinking configuration rather than a current sourcing configuration (as is the case in FIG. 2). As a result, the output device in FIG. 3 is connected between the $V_{SUPPLY}$ terminal of the voltage supply and the output transistor Q1'. Also, the MOSFET which implements Q1' is an N channel MOSFET rather than a P channel MOSFET, and the transistors which implement Q2' and Q3' are NPN transistors rather than PNP transistors. Other than the differences associated with the use of a current sinking than current sourcing configuration, the operation of the circuit in FIG. 3 is exactly the same the operation of the circuit in FIG. 2. Therefore, to avoid redundancy, this description is not repeated.

Figure 4:
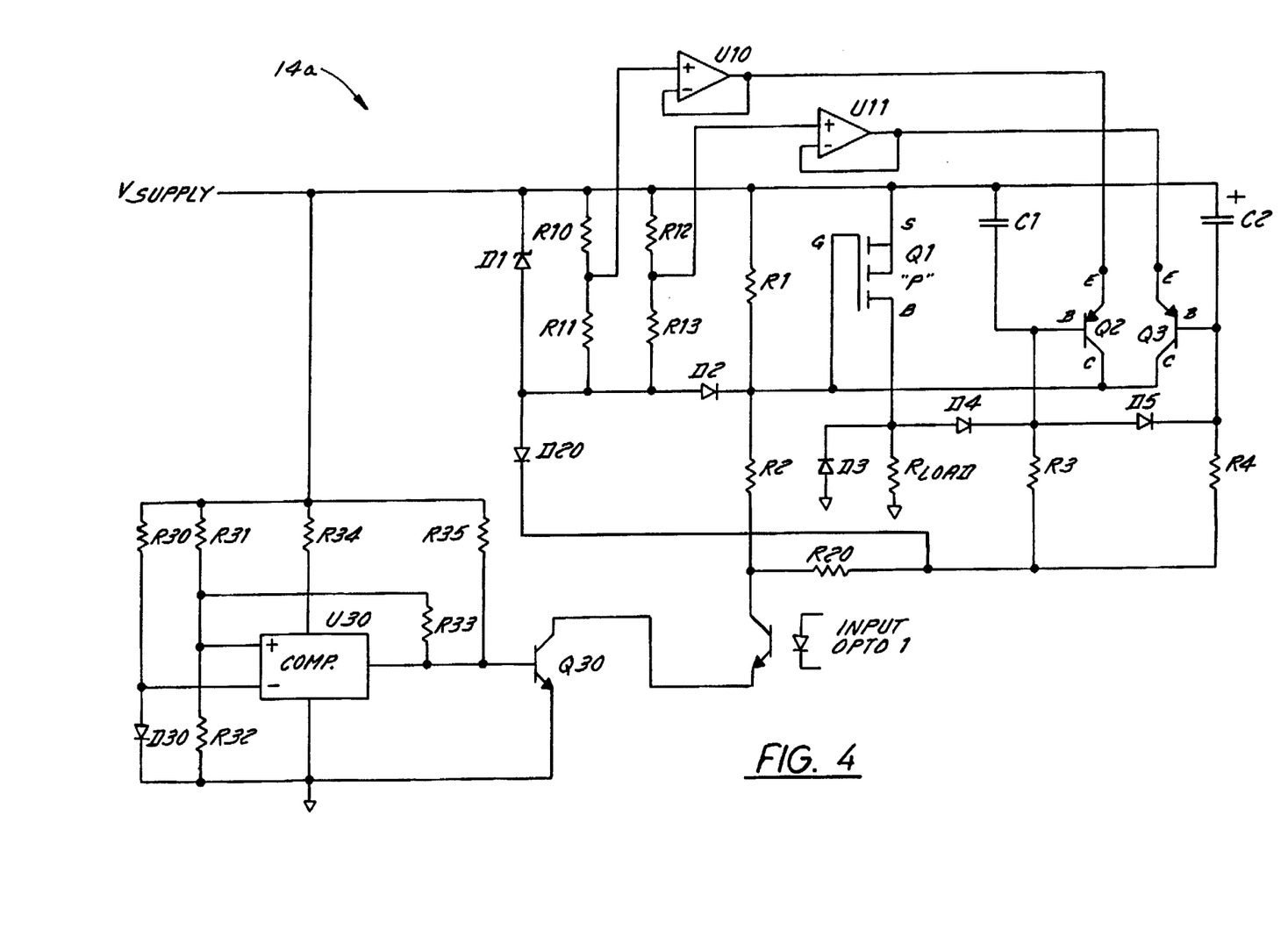
FIG. 4 illustrates another alternative embodiment of the output circuit of FIG. 2, according to the present invention.

Referring now to FIG. 4, another alternative embodiment of the output circuit of FIG. 2 is illustrated in which several additional features are added. It should be noted that the features are shown in the same drawing figure only for purposes of simplicity, and that the additional features can be used either alone or in combination. It should also be noted that the output circuit is quite flexible, and it is possible to make numerous other additions or changes to the output circuit in addition to or instead of those described below.

The first additional feature is a pair of voltage reference circuits implemented by resistors R10 and R11 and operational amplifier U10 and by resistors R12 and R13 and operational amplifier U11. As noted above, the forward bias voltage of the LED of the fault optoisolator OPTO2 is one of the parameters which determines the point at which the transistors Q2 and Q3 taun on. In order to provide greater control over the turn on points of the transistors Q2 and Q3, the two voltage reference circuits are provided which replace the fault optoisolator OPTO2. The voltage reference circuits permit greater control of the turn on points for the transistors Q2 and Q3, because the resistor combinations can be precisely varied to achieve a desired turn on point. The fact that two separate voltage reference circuits are provided enables greater individual control over the two turn on points for the transistors Q2 and Q3, because the resistor combinations R10/R11 and R12/R13 can be varied separately for the transistors Q2 and Q3, respectively.

The second additional feature is circuitry to reduce current limit variations which occur as a result of variations in the voltage supply. This circuitry is implemented by a diode D20 and a resistor R20. The diode D20 is inserted between the junction of the anodes of the diodes D1 and D2 and the junction of the resistors R3 and R4. The resistor R20 is inserted in between the junction of the resistors R3 and R4 and the collector of the input optoisolator OPTO1, so that the resistors R3 and R4 are connected to the collector of the input optoisolator OPTO1 by way of the resistor R20. The diodes D20 and D1 clamp the resistors R3 and R4 such that charging currents for the capacitors C1 and C2 and biasing currents for the transistors Q2 and Q3 are kept clamped for supply voltage variations.

Finally, the third additional feature is a comparator circuit implemented by a comparator U30, resistors R30–R35, a diode D30, and a transistor Q30. The comparator circuit detects when the voltage supply is too low to ensure adequate turn on of the transistor Q1, and responds to such a condition by disabling the input optoisolator OPTO1. To detect when the voltage supply is too low, the circuit comprises a comparator U30 which compares a reference voltage established between the diode D30 and the resistor R30 with a voltage established between the resistors R31 and R32. When this comparison reveals that the supply voltage is too low, the comparator UIO turns off the transistor Q30. When the transistor Q30 is turned off, the input optoisolator OPTO1 is disabled because the emitter terminal of the input optoisolator OPTO1 is connected to ground by way of the transistor Q30. No current can flow through the common and emitter of the input optoisolator OPTO1 when the transistor Q30 is turned off. The remaining resistors R33–R35 support the comparator U30 (the resistor R33 establishes a hysteresis, the resistor R34 provides signal conditioning, and the resistor R35 is a pull-up resistor).

The present invention has numerous advantages over existing protection schemes for output transistors of output circuits. First, the output circuit utilizes highly flexible two-stage protection circuitry. The protection circuitry separately identifies surge current and overcurrent conditions. Thus, a current of a given magnitude which appears for only a short duration (e.g., an initially large current drawn by an inductive output device or lamp load) need not activate the protection circuitry, whereas the same current for a longer period of time (e.g., an overcurrent condition) could activate the protection circuitry. As a result, the output transistor can be chosen so as to be more closely tailored to the application. As compared to the use of a current-limited transistor, for example, it is no longer necessary to select an output transistor which is larger than necessary (with respect to its current rating) in order to ensure that minor surge currents do not present a problem.

In addition to the flexibility provided by the use of two-stage protection circuitry, flexibility is also provided by the fact that component values may be easily varied to vary the magnitudes/durations of current within each stage which activate the protection circuitry. As a result, the protection circuitry can be used with different types of output transistors rated for different amounts of current. Also, once an output transistor is selected, the protection circuitry can be more closely tailored to the maximum current ratings and thermal ratings of the selected output transistor.

Second, the protection circuitry has a very fast response time. As compared to thermal detection systems, the protection circuitry provided by the present invention is able to detect short circuits much more quickly. This is because it is unnecessary for heat dissipated by the output transistor to be transferred to and detected by another part of the circuit. Rather, the protection circuitry of the present invention operates by detecting voltage changes across the output transistor—changes which may be detected much more rapidly. As a result, an output transistor which is protected by the protection circuitry of the present invention suffers much less stress in the event of a short circuit condition.

Third, the output circuit does not use a sensing resistor. Therefore, the expense and heat dissipation associated with protection circuits which do use sensing resistors is avoided.

Fourth, the output circuit is implemented with a relatively small number of components, thereby making the output circuit inexpensive to implement. Also, the fact that the output circuit may be implemented with a relatively small number of components makes it easy to incorporate these components into an integrated circuit, thereby further reducing the cost of the output circuit.

Fifth, the output circuit is relatively insensitive to temperature variations. Assuming that the output transistor, the diodes, and the capacitors are placed physically close together, variations with temperature of the internal resistance of the output transistor are largely offset by corresponding variations of parameters associated with the diodes and transistors.

Finally, the arrangement and configuration of the output circuit make the output circuit relatively robust as against a variety of current conditions. For example, if the output device produces a pulsed short circuit at $R_{LOAD}$, the capacitors C1 and C2 remain at least partially charged from pulse to pulse. As a result, the protection circuitry reacts more quickly to subsequent short circuits in the pulsed train of short circuits.

Many other changes and modifications may be made to the present invention without departing from the spirit thereof. The scope of these changes will become apparent from the appended claims.

We claim:

1. A protection circuit for protecting an output circuit against a current flow condition, said output circuit having a first transistor which provides power conditioning for an output signal that controls an output device, said protection circuit comprising:

a sensing device which is connected to said first transistor, said sensing device sensing said current flow condition, said current flow condition involving a current which flows through said first transistor and which is supplied to said output device; and a second transistor which is connected to said sensing device and to said first transistor, said second transistor responding to said sensing device during said current flow condition by overriding said output signal and turning off said first transistor;

wherein said sensing device senses said current flow condition by sensing a voltage drop produced across two terminals of said first transistor, said two terminals being the terminals through which said current flows; and wherein, when said second transistor turns off said first transistor, a bias current flows through said second transistor that causes said second transistor to turn on, the turning on of said second transistor causing said first transistor to turn off, said bias current being produced by said voltage drop across said two terminals of said first transistor, and wherein substantially none of said bias current flows through said output device.

2. A protection circuit according to claim 1, werein said sensing device comprises a diode and a capacitor;

wherein said sensing device senses said current flow condition by sensing said voltage drop produced across said two terminals of said first transistor in combination with a voltage drop produced across said diode;

wherein said second transistor overrides said output signal and turns off said first transistor in response to said capacitor reaching a predetermined level of charge.

3. A protection circuit for protecting an output circuit against first and second current flow conditions, said output circuit having a first transistor which provides power conditioning for an output signal that controls an output device, said protection circuit comprising:

a first sensing device which is connected to said first transistor, said first sensing device sensing said first current flow condition, said first current flow condition involving a current which flows through said first transistor and which is supplied to said output device; and a second transistor which is connected to said sensing device and to said first transistor, said second transistor responding to said first sensing device during said first current flow condition by overriding said output signal and turning off said first transistor;

a second sensing device which is connected to said first transistor, said second sensing device sensing said second current flow condition, said second current flow condition involving said current; and a third transistor which is connected to said second sensing device and to said first transistor, said third transistor responding to said second sensing device during said second current flow condition by overriding said output signal and turning off said first transistor;

wherein said first sensing device senses said first current flow condition by sensing a voltage drop produced across two terminals of said first transistor, said two terminals being the terminals through which said current flows; and wherein said second sensing device senses said second current flow condition by sensing said voltage drop produced across said two terminals of said first transistor.

4. A protection circuit according to claim 3, wherein said first current flow condition is a surge current condition and said second current flow condition is an overcurrent condition.

5. A method of protecting an output transistor against a current flow condition, said output transistor being used for power conditioning an output signal that controls an output device, the method comprising:

sensing said current flow condition using a voltage which appears across two terminals of said output transistor, said current flow condition involving a current which flows through said output transistor and which is supplied to said output device, and said two terminals being the terminals through which said current flows;

turning on a protection transistor in response to said current flow condition being sensed, said turning on step including the step of providing said protection transistor with a bias current, said bias current being produced by said voltage across said two terminals of said output transistor, and substantially none of said bias current flowing through said output device; and turning off said output transistor in response to said protection transistor being turned on.

6. An output circuit for power conditioning an output signal which controls an output device, said output circuit comprising:

a first transistor connected to said output device, said first transistor turning on when said output signal assumes a first state and turning off when said output signal assumes a second state, and said first transistor power conditioning said output signal, said first transistor having a voltage appearing across two terminals thereof, said voltage having a magnitude which increases as said magnitude of said current through said first transistor increases;

a second transistor connected to said first transistor, said second transistor overriding said output signal and turning off said first transistor when a magnitude of current through said first transistor exceeds a first predetermined magnitude for a first predetermined amount of time; and a third transistor connected to said first switching device, said third transistor overriding said output signal and turning off said first transistor when the magnitude of current through said first transistor exceeds a second predetermined magnitude for a second predetermined amount of time;

a first sensing circuit, said first sensing circuit being connected to said first and second transistors, said first sensing circuit sensing whether the magnitude of current through said first transistor has exceeded said first predetermined magnitude for said first predetermined amount of time and responding by causing said second transistor to override said output signal and turn off said first transistor;

a second sensing circuit, said second sensing circuit being connected to said first and third transistors, said second sensing circuit sensing whether the magnitude of current through said first transistor has exceeded said second predetermined magnitude for said second predetermined amount of time and responding by causing said third transistor to override said output signal and turn off said first transistor;

and wherein said first and second sensing devices sense the magnitude of said current through said first transistor by sensing the magnitude of said voltage drop across said two terminals of said first transistor.

7. An output circuit according to claim 6, wherein said first predetermined magnitude and said first predetermined amount of time corresponds to a surge current condition, and wherein said second predetermined magnitude and said second predetermined amount of time correspond to an overcurrent condition.

8. An output circuit according to claim 6, wherein said first sensing circuit comprises a diode and a capacitor;

wherein said first sensing circuit senses whether the magnitude of current through said first transistor has exceeded said first predetermined magnitude for said first predetermined amount of time by sensing said voltage drop across said two terminals said first transistor in combination with a voltage drop produced across said diode; and wherein said second transistor overrides said output signal and turns off said first transistor in response to said capacitor reaching a predetermined level of charge.

9. An output circuit according to claim 6, wherein a voltage supply input of said second transistor is connected to a voltage supply by way of a first voltage reference circuit, and wherein a voltage supply input of said third transistor is connected to said voltage supply by way of a second voltage reference circuit.

10. An output circuit according to claim 6, further comprising a comparator circuit which disables said output circuit when a magnitude of a voltage supply which supplies said first transistor drops below a predetermined level.

11. An output circuit according to claim 6, wherein, when said second transistor turns off said first transistor, a first bias current flows through said second transistor that causes said second transistor to turn on, the turning on of said second transistor causing said first transistor to turn off, said first bias current being produced by said voltage drop across said two terminals of said first transistor, and wherein substantially none of said first bias current flows through said output device; and wherein, when said third transistor turns off said first transistor, a second bias current flows through said third transistor that causes said third transistor to turn on, the turning on of said third transistor causing said first transistor to turn off, said second bias current being produced by said voltage drop across said two terminals of said first transistor, and wherein substantially none of said second bias current flows through said output device.

12. An output circuit for power conditioning an output signal which controls an output device, said output circuit comprising:

A. a first transistor connected to said output device, said first transistor turning on when said output signal assumes a first state and turning off when said output signal assumes a second state, said first transistor power conditioning said output signal;

B. a surge current protection stage, including
  (1) a surge current sensing circuit which is connected to said first transistor and which senses a surge current condition, and
  (2) a second transistor connected to said surge current sensing circuit and said first transistor, said second transistor overriding said output signal and turning said first transistor off in response to said surge current condition; and C. an overcurrent protection stage, including
  (1) an overcurrent sensing circuit which is connected to said first transistor and which senses an overcurrent condition, and
  (2) a third transistor connected to said first transistor, said third transistor overriding said output signal and turning said first transistor off in response to an overcurrent condition.

13. An output circuit according to claim 12, wherein said surge current sensing circuit comprises a diode and a capacitor;

wherein said surge current sensing circuit senses said surge current condition by sensing a voltage drop across a voltage supply input and an output of said first transistor in combination with a voltage drop produced across said diode; and wherein said second transistor overrides said output signal and turns off said first transistor in response to said capacitor reaching a predetermined level of charge.

14. A programmable controller system having an output module which utilizes the output circuit according to claim 12.

15. An output circuit according to claim 12, wherein, when said second transistor turns off said first transistor, a first bias current flows through said second transistor that causes said second transistor to turn on, the turning on of said second transistor causing said first transistor to turn off, said first bias current being produced by said voltage drop across said two terminals of said first transistor, and wherein substantially none of said first bias current flows through said output device; and wherein, when said third transistor turns off said first transistor, a second bias current flows through said third transistor that causes said third transistor to turn on, the turning on of said third transistor causing said first transistor to turn off, said second bias current being produced by said voltage drop across said two terminals of said first transistor, and wherein substantially none of said second bias current flows through said output device.

16. An output circuit for power conditioning an output signal which controls an output device, said output circuit comprising:

an input device, said input device being adapted for receiving said output signal, said input device having a voltage supply input and an output, said voltage supply input being connected to a first terminal of a voltage supply;

a first resistor, said first resistor having first and second terminals, said first terminal being connected to a second terminal of said voltage supply, one of said first and second voltage supply terminals being a ground terminal;

a second resistor, said second resistor having a first terminal connected to said output of said input device and a second terminal connected to said second terminal of said first resistor;

a first transistor, said first transistor having a signal input connected to said second terminal of said second resistor, a voltage supply input connected to said second terminal of said voltage supply, and an output connected to a first terminal of said output device, said output device having a second terminal connected to said first terminal of said voltage supply, and said first transistor power conditioning said output signal;

a first diode, said first diode having first and second terminals, said first terminal being connected to said output of said first transistor;

a third resistor, said third resistor having a first terminal connected to said second terminal of said first diode and a second terminal connected to said output of said input device;

a second diode, said second diode having first and second terminals, said first terminal being connected to said first terminal of said third resistor;

a fourth resistor, said fourth resistor having a first terminal connected to said second terminal of said second diode and a second terminal connected to said output of said input device;

a first capacitor, said first capacitor having a first terminal connected to said second terminal of said voltage supply and a second terminal connected to the first terminal of said third resistor;

a second transistor, said second transistor having a voltage supply input, a signal input connected to said second terminal of said first capacitor, and an output connected to said signal input of said first transistor;

a second capacitor, said second capacitor having a first terminal connected to said second terminal of said voltage supply and a second terminal connected to the first terminal of said fourth resistor; and a third transistor, said third transistor having a voltage supply input, a signal input connected to said second terminal of said second capacitor, and an output connected to said signal input of said first transistor; and wherein said second transistor turns off said first transistor in response to a first current flow condition sensed by said first diode, said third resistor, and said first capacitor; and wherein said third transistor turns off said first transistor in response to a second current flow condition sensed by said first and second diodes, said fourth resistor, and said second capacitor.

17. An output circuit according to claim 15, wherein said voltage supply input of said second transistor is connected to said second terminal of said voltage supply by way of a first voltage reference circuit, and wherein said voltage supply input of said third transistor is connected to said second terminal of said voltage supply by way of a second voltage reference circuit.

18. An output circuit according to claim 15,
wherein said first current flow condition is sensed by sensing a voltage drop across said voltage supply input and said output of said first transistor in combination with a voltage drop across said first diode; and
wherein said second current flow condition is sensed by sensing the voltage drop across said voltage supply input and said output of said first transistor in combination with said voltage drop across said first diode in combination with a voltage drop across said second diode.

19. An output circuit according to claim 15, wherein said voltage supply input of said input device is connected to a comparator circuit, said comparator circuit comparing the magnitude of said voltage supply with a predetermined threshold level and disabling said input device when said magnitude of said voltage supply is too low.

20. A programmable controller system having an output module which utilizes the output circuit according to claim 15.

* * * * *